(12) United States Patent
Newman et al.

(10) Patent No.: US 6,504,860 B2
(45) Date of Patent: Jan. 7, 2003

(54) PURGE MONITORING SYSTEM FOR GAS DISCHARGE LASER

(75) Inventors: Peter C. Newman, San Diego, CA (US); John Van Doorn, San Diego, CA (US); Darrel W. Fullen, San Diego, CA (US); William H. Clopton, National City, CA (US); Shahryar Rokni, Carlsbad, CA (US)

(73) Assignee: Cymer, Inc., San Diego, CA (US)

( * ) Notice: Subject to any disclaimer, the term of this patent is extended or adjusted under 35 U.S.C. 154(b) by 34 days.

(21) Appl. No.: 09/837,150

(22) Filed: Apr. 18, 2001

(65) Prior Publication Data

US 2002/0101903 A1 Aug. 1, 2002

Related U.S. Application Data

(63) Continuation-in-part of application No. 09/771,789, filed on Jan. 29, 2001.

(51) Int. Cl.[7] .................................................. H01S 3/22
(52) U.S. Cl. ............................ 372/59; 372/57; 372/58
(58) Field of Search .............................. 372/57, 58, 59, 372/20, 102

(56) References Cited

U.S. PATENT DOCUMENTS

| | | | |
|---|---|---|---|
| 3,845,409 A | 10/1974 | Wada et al. | 331/94.5 |
| 4,977,563 A | 12/1990 | Nakatani et al. | 372/32 |
| 5,095,492 A | 3/1992 | Sandstrom | 372/102 |
| 5,463,650 A | * 10/1995 | Ito et al. | 372/57 |
| 6,128,323 A | 10/2000 | Myers et al. | 372/38 |
| 6,151,350 A | * 11/2000 | Komori et al. | 372/59 |

FOREIGN PATENT DOCUMENTS

| | | | |
|---|---|---|---|
| JP | 04-314374 | 11/1992 | 3/136 |
| JP | 05-167172 | 7/1993 | 3/137 |
| JP | 2631607 | 7/1997 | 3/38 |
| JP | 2696285 | 9/1997 | 3/137 |

OTHER PUBLICATIONS

Alvarez, Jr., Dan et al., "Exposure of Inert Gas Purifiers to Air—Studies of Hydrocarbon Release in Resin–Based vs. Nickel–Based Purifiers", Journal of the IEST, 41(6):26–32 (Nov/Dec. 1998).

Press, William H. et al., "Numerical Recipes, The Art of Scientific Computing", Cambridge, University Press (1990), pp. 274–277, 289–293 and 312–321.

* cited by examiner

Primary Examiner—Hemang Sanghavi
(74) Attorney, Agent, or Firm—John R. Ross

(57) ABSTRACT

A laser component purge system for discharge lasers. The LNP, the output coupler and the wavemeter are contained in sealed chambers each having a purge inlet port and a purge outlet port. Purge gas such as $N_2$ is directed to each of the inlet ports. A purge monitoring system is provided which monitors the purge flow and provides one or more signals to a processor which is programmed to minimize laser timeouts attributable to purge conditions without endangering the purged optical components. In a preferred embodiment, gas exiting the outlet ports are directed to flow monitors which provide the one or more signals to the processor. Purge gas may be exhausted or recirculated.

14 Claims, 4 Drawing Sheets

PURGE MONITORING SYSTEM FOR GAS DISCHARGE LASER

This invention relates to lasers and in particular to high power gas discharge lasers with a grating based line narrowing unit. This invention is a continuation-in-part of Ser. No. 09/771,789, filed Jan. 29, 2001.

BACKGROUND OF THE INVENTION

Narrow Band Gas Discharge Lasers

Gas discharge ultraviolet lasers used as a light source for integrated circuit lithography typically are line narrowed. A preferred line narrowing prior art technique is to use a grating based line narrowing unit, called a line narrowing package or "LNP", along with an output coupler to form the laser resonance cavity. These systems also include a wavemeter in which laser pulse energy and wavelength are measured. The gain medium within this cavity is produced by electrical discharges (produced by a pulse power system) into a circulating laser gas such as krypton, fluorine and neon (for a KrF laser); argon, fluorine and neon (for an ArF laser); or fluorine and helium and/or neon (for an $F_2$ laser). Discharges in these lasers are produced by high voltage pulses with peak voltages in the range of between about 15,000 volts to 30,000 volts. A typical prior art excimer laser is described in U.S. Pat. No. 6,128,323 which is incorporated herein by reference.

It is known to provide nitrogen purges to selected optical and high voltage components of these laser systems. The optical components including the LNP, the output coupler and the wavemeter are purged primarily to prevent damage to the optical components caused by the interaction of oxygen or other airborne contaminants with the components in the presence of ultraviolet radiation. High voltage components are purged to prevent flashovers which can occur in the presence of air, especially air containing contaminants. The purged high voltage components include (1) a high voltage cable connecting the portion of the pulse power system called the commutator to another portion called the compression head and (2) the high voltage components mounted on top of the laser chamber which includes a bank of capacitors which accumulate the discharge pulse energy and the additional electrical components within the compression head all of which operate at voltages in excess of about 15,000 volts at the electrical peak of each pulse.

These purge systems are important for KrF lasers which produce a laser beam at a wavelength about 248 nm but they are even more important for ArF lasers and $F_2$ lasers which produce much more energetic beams and operate at higher discharge voltages.

The $N_2$ purge systems typically used in prior art excimer laser systems consists of an $N_2$ line which directs flowing purge gas to a chamber containing the components being purged. The $N_2$ merely floods the chamber and exits through miscellaneous openings. Only in particular circumstances is it normal practice even to provide a specific outlet port and when an outlet port is provided, the chamber is typically not sealed so that the $N_2$ may exit various miscellaneous openings.

Start Up Timeouts

When a laser system is started, upon initial installation or after a service procedure, the purge flow must be established for a certain period of time before light output begins; this allows a clean, oxygen-free environment to be established within the optical modules. One conventional way to achieve this is to have the laser control system enforce a predetermined "timeout" period whenever the laser power is first turned on. This may not be desirable, since the power interruption does not necessarily mean that the purge system integrity has been compromised. In addition, some service procedures could disturb the purge system integrity without interrupting the laser power or initiating a timeout sequence. Excimer lasers are often used in semiconductor processing facilities, where substantial operating losses can occur during equipment idle time. Thus, there is a strong desire to maximize the useable operation time of the laser system, and eliminate any unnecessary wait periods. In this specification and the claims we will use the phrase "laser timeout" to refer to time periods when the laser is unavailable to produce laser light due to lack of purge flow or uncertainty regarding the laser purge equipment.

What is needed is a system for maintaining and monitoring the inert purge gas flow through a laser system, regardless of the state of the power applied to the laser. Such a purge system would allow resumption of laser operations as soon as is consistent with protection of optical components.

SUMMARY OF THE INVENTION

The present invention provides a laser component purge system for discharge lasers. The LNP, the output coupler and the wavemeter are contained in sealed chambers each having a purge inlet port and a purge outlet port. Purge gas such as $N_2$ is directed to each of the inlet ports. A purge monitoring system is provided which monitors the purge flow and provides one or more signals to a processor which is programmed to minimize laser timeouts attributable to purge conditions without endangering the purged optical components. In a preferred embodiment, gas exiting the outlet ports are directed to flow monitors which provide the one or more signals to the processor. Purge gas may be exhausted or recirculated.

DETAILED DESCRIPTION OF PREFERRED EMBODIMENTS

Preferred embodiments of the present invention may be described by reference to the drawings.

First Preferred Embodiment

Figure 1:
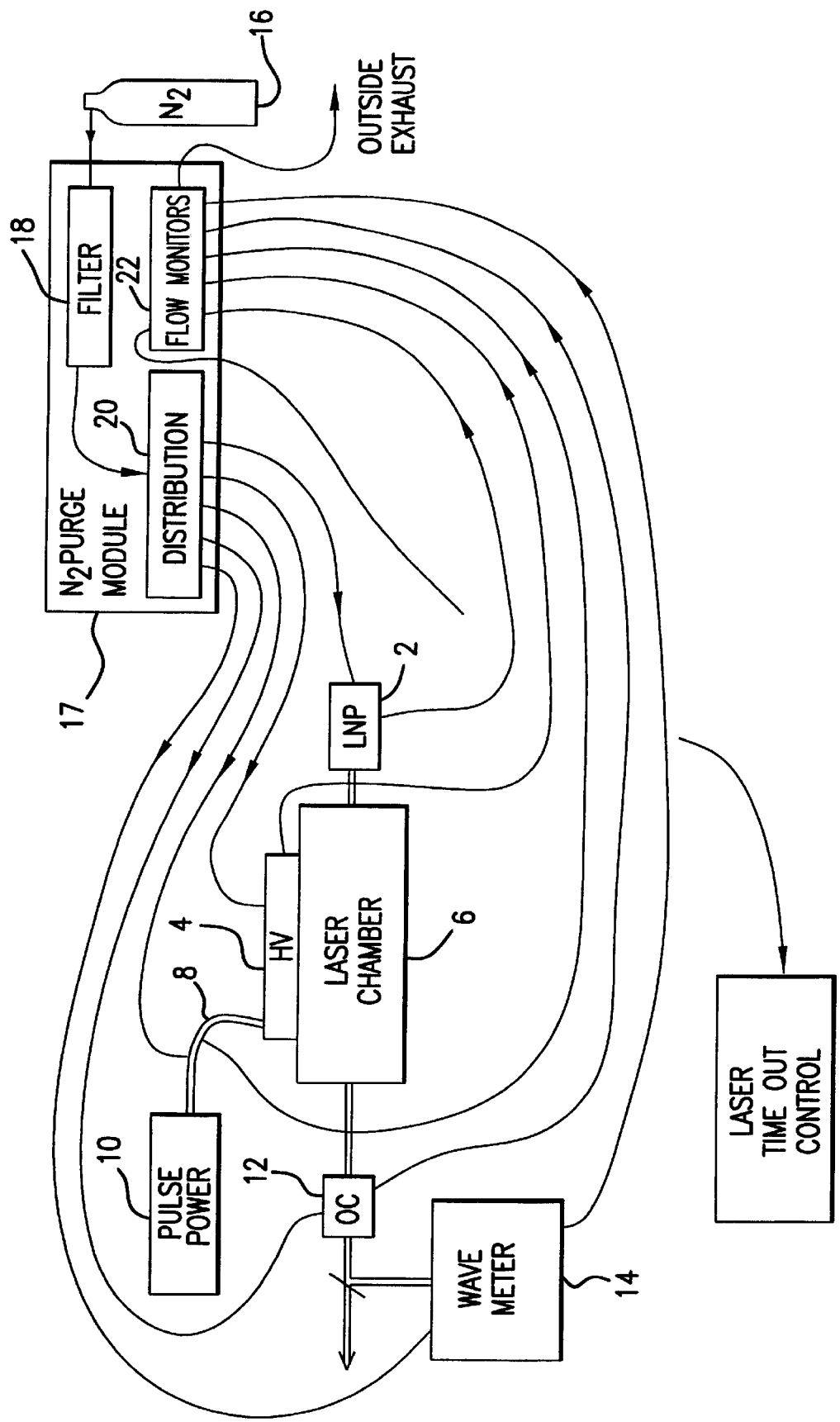
FIG. 1 is a block diagram of a preferred embodiment of the present invention.

FIG. 1 is a block diagram showing important features of a first preferred embodiment the present invention. Five excimer laser components which are purged by nitrogen gas in this embodiment of the present system are LNP 2, high voltage components 4 mounted on laser chamber 6, high voltage cable 8 connecting the high voltage components 4 with upstream pulse power components 10, output coupler 12 and wavemeter 14. Each of the components 2, 4, 8, 12, and 14 are contained in sealed containers or chambers each having only two ports an $N_2$ inlet port and an $N_2$ outlet port. An $N_2$ source 16 which typically is a large $N_2$ tank (typically maintained at liquid nitrogen temperatures) at a integrated circuit fabrication plant but may be a relatively small bottle of $N_2$. $N_2$ source gas exits $N_2$ source 16, passes into $N_2$ purge module 17 and through $N_2$ filter 18 to distribution panel 20 containing flow control valves for controlling the $N_2$ flow to the purged components. With respect to each component, after passing through the container or chamber enclosing the component, the purge flow is directed back to the module 17 to a flow monitor unit 22 where the flow returning from each of the purge units is monitored and in case the flow monitored is less than a predetermined value an alarm (not shown) is activated.

Figure 2:
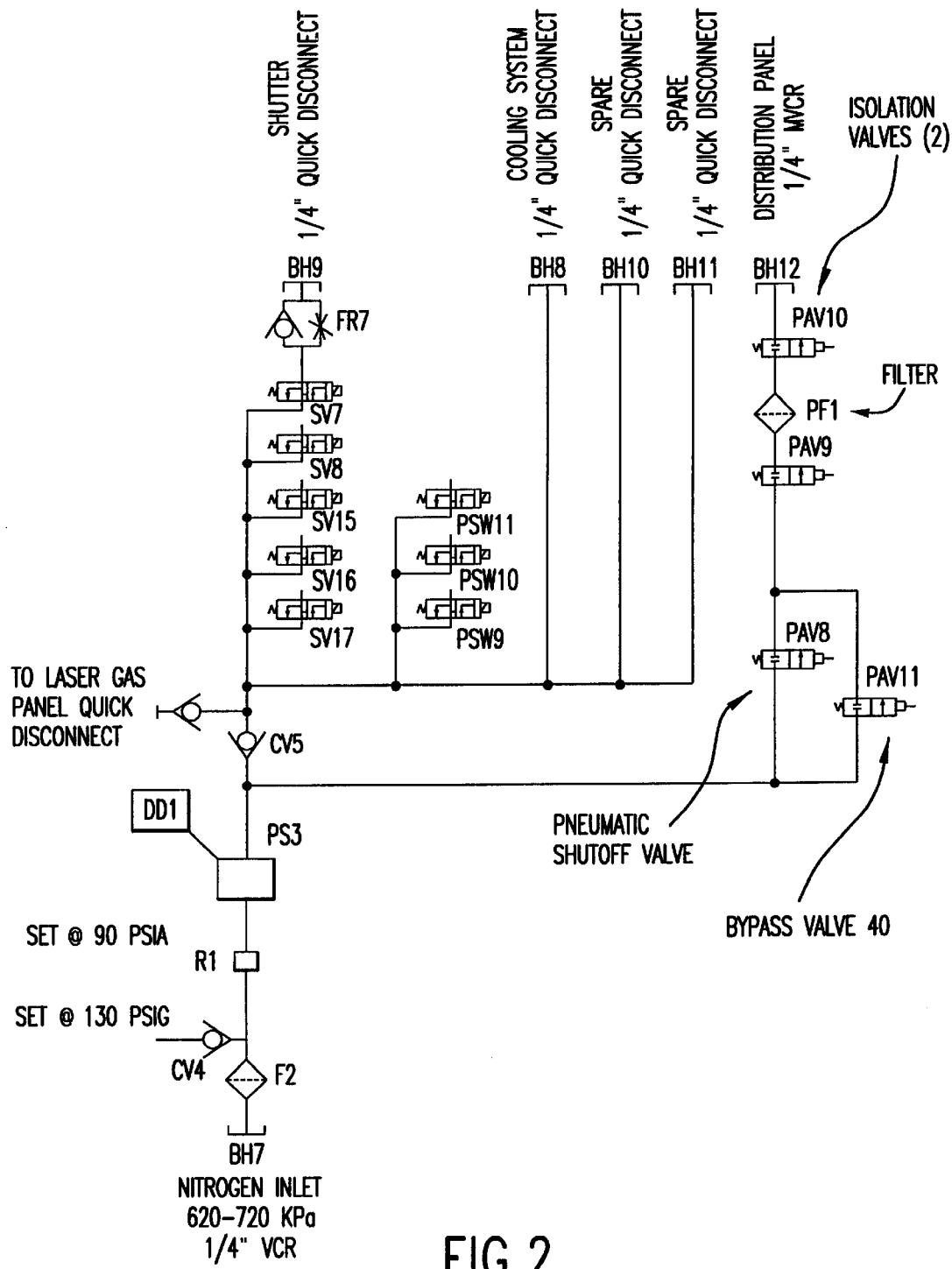
FIG. 2 is a line diagram showing components of the preferred embodiment.
Figure 3:
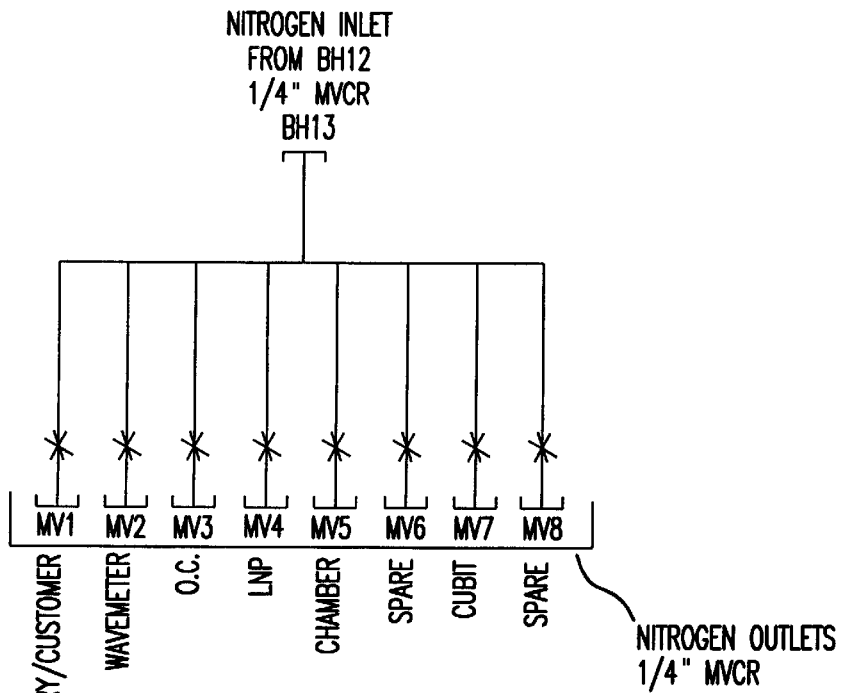
FIG. 3 is a line diagram showing elements of a distribution panel.
Figure 4:
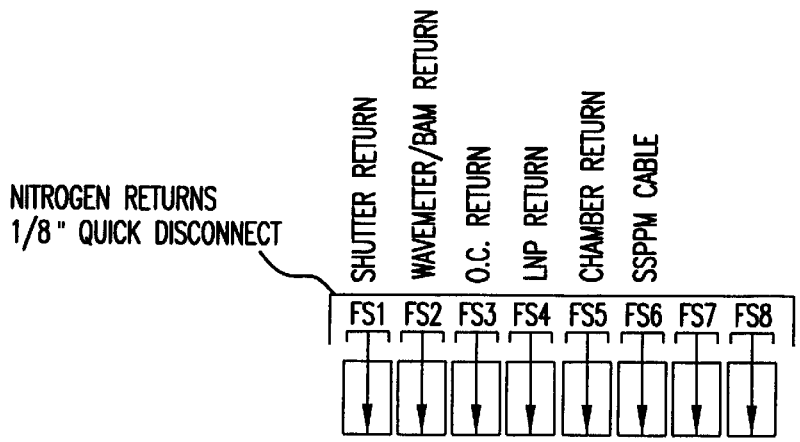
FIG. 4 is a line diagram showing elements of a flow monitor unit.

FIG. 2 is a line diagram showing specific components of this preferred embodiment including some additional $N_2$ features not specifically related to the purge features of the present invention. FIG. 3 is a line diagram showing the elements of the distribution panel 20 and FIG. 4 is a line drawing showing features of the flow monitoring unit 22.

$N_2$ Filter

In one embodiment of the present invention an $N_2$ filter 18 is included. In the past, makers of excimer lasers for integrated circuit lithography have believed that a filter for $N_2$ purge gas was not necessary since $N_2$ gas specification for commercially available $N_2$ is almost always good enough so that gas meeting specifications is clean enough. Applicants have discovered, however, that occasionally the source gas may be out of specification on the $N_2$ lines leading to the purge system may contain contamination. Also lines can become contaminated during maintenance or operation procedures. Applicants have determined that the cost of the filter is very good insurance against an even low probability of contamination caused by optics damage or high voltage flashover damage.

A preferred $N_2$ filter is Model 500 K Inert Gas Purifier available from Aeronex, Inc. with offices in San Diego, Calif. This filter removes $H_2O$, $O_2$, CO, $CO_2$, $H_2$ and non-methane hydrocarbons to sub parts per billion levels. It removes 99.9999999 percent of all particulate 0.003 microns or larger.

Flow Monitors

A flow monitor in unit 22 is provided for each of the five purged components. These are commercially available units having an alarm feature for low flow.

Piping

Preferably all piping is comprised of stainless steel (316SST) with electro polished interior.

Recirculation

Figure 5:
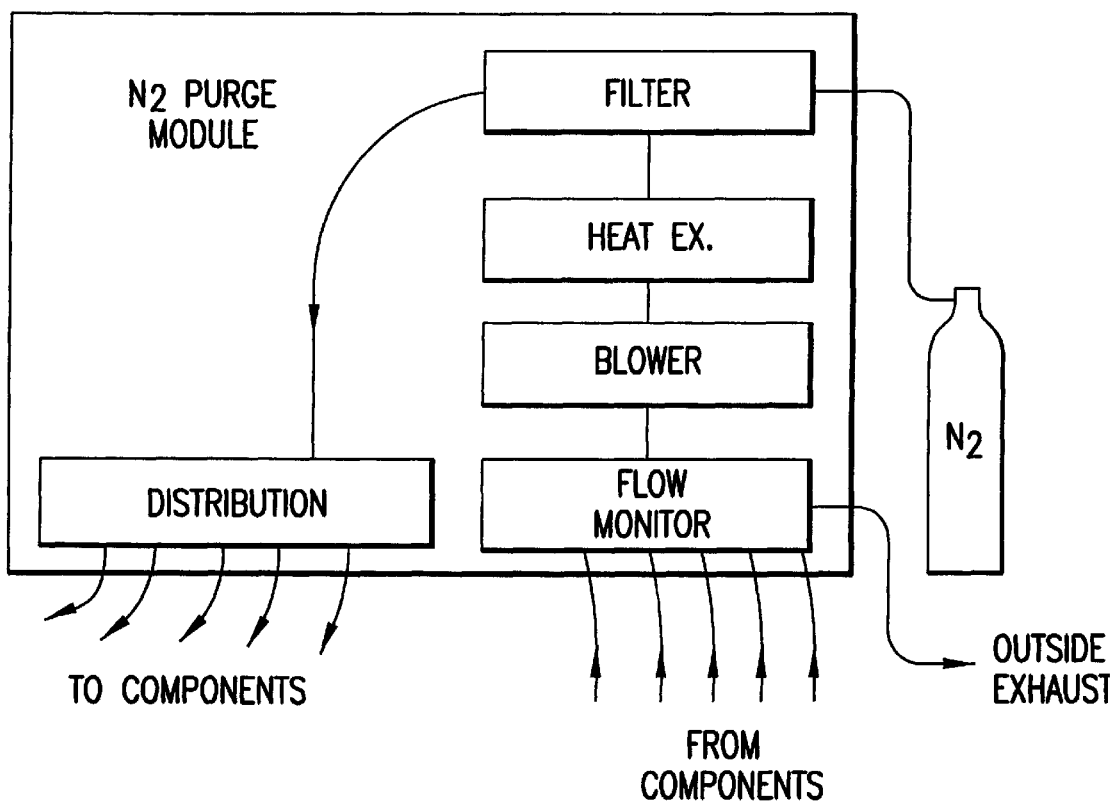
FIG. 5 shows how the purge gas could be recirculated.

A portion or all of the purge gas could be recirculated as shown in FIG. 5. In this case, a blower and a water cooled heat exchanger is added to the purge module. For example, purge flow from the optical components could be recirculated and purge flow from the electrical components could be exhausted or a portion of the combined flow could be exhausted.

Monitoring Equipment and Procedures

The following described equipment and procedures are preferred for assuring appropriate protection of optical components from UV generated ozone while minimizing laser timeout periods.

1. Nitrogen or another inert gas is supplied to the laser from the facility. The laser gas control module regulates the gas pressure, may provide additional purification, and distributes controlled amounts of this purge gas to the optical modules.
2. In a preferred embodiment, manually operated bypass valve 40 (as shown in FIG. 2) is included for the gas control module to allow the operator to maintain purge flow through the laser system, even under conditions where the laser electrical power is turned off.
3. The optical modules are suitably well sealed to contain the purge gas and prevent intrusion of atmospheric oxygen or other contaminants. More than one optical module may be interconnected into a common purge volume, and each volume has at least one purge gas exit port.
4. The flows from these exit ports are routed back to the gas control module, where the flow levels are preferably monitored, perhaps by one or more flow switches. The gas module may have one switch for each purge volume or another arrangement. These switches would have electrical contacts, which might open or close if the purge gas flow falls below a predetermined value (0.5 liters per minute, for example).
5. The gas control module contains electrical circuitry to monitor the status of the switches, and record this status over some period of time (15 minutes for example). Programmable logic devices are recommended to allow the users a high degree of control over the operation of the circuit. This circuit could be configured to operate independently from the laser electrical power system, perhaps using a battery or a capacitor as a power source.
6. The purge flow monitor circuit can make a summary of this purge flow status available to the laser control module, with, for example, a digital purge status signal line. This status information can be used by the control module to decide whether to allow laser light output.
7. Preferably, purge status signal is arranged to immediately report any interruption in purge flow to the control module as a purge fault. This purge fault should be continuously reported until a suitable time has elapsed after the purge flow has been restored.
8. Based on established characteristics of one or more of the optical modules, the time duration of a purge flow interruption is in a preferred embodiment used to determine the appropriate minimum time to wait before resuming laser firing. For example, suitably short interruptions in the purge flow (perhaps less than 30 seconds) may not prevent firing at all. However, interruptions between 30 seconds and 5 minutes could dictate wait times between 0 and 15 minutes, respectively. In this example, any interruption over 5 minutes might require a 15 minute wait time.
9. In the event that low purge flow conditions are recorded during laser firing operation, a warning is preferably issued to the operator. If the low flow condition persisted for some predetermined period (for example 5 minutes), an error condition might be reported to the operator and/or the laser firing halted.

Oxygen Monitor

In another embodiment of the present invention, the flow switches described above could be replaced with oxygen concentration detectors, or a system to allow a single oxygen detector to monitor several lines simultaneously or in sequence.

In this alternate embodiment, the oxygen concentration status would be monitored and reported in place of the flow status. The laser might be inhibited from firing until the oxygen concentration was measured to be below some predetermined level. This would remove the reliance on timing and the characteristics of the optical modules.

Advantages of the System

The system described herein represents a major improvement in long term excimer laser performance especially for ArF and F2 lasers. Contamination problems are basically eliminated which has resulted in substantial increases in component lifetimes and beam quality. In addition, since leakage has been eliminated except through outlet ports the flow can be controlled to desired values which has the effect of reducing N2 requirements by about 50 percent. By monitoring the purge system, either through flow monitoring or oxygen monitoring laser timeouts due to purge issues can be minimized without endangering optical components.

The reader should recognize that the above embodiment of this invention is provided as an example and many other embodiments of the present invention are possible. For example, additional components could be added to as purged components. For example, optical test equipment could be purged using the system. Purge gases other than $N_2$ could be used. Other possibilities include argon, helium, neon or krypton. Therefore, preferably several spare purge and monitor elements would be included in the system when it is initially fabricated. Also, instead of operation of the manual bypass valve 40 the purge system could be configured to provide for continuation of flow using one or more processor controlled valves. Therefore, the scope of the present invention should be determined by the appended claims and their legal equivalents.

We claim:

1. A gas discharge laser system comprising:
    A) a gas discharge laser comprising:
        1) line narrowing components for narrowing bandwidth of laser beams produced by said laser contained in a sealed line narrowing chamber having a purge inlet port and a purge outlet port;
        2) an output coupler contained in a sealed output coupler chamber having a purge inlet port and a purge outlet port; and
        3) a wavemeter contained in a sealed wave meter chamber having a purge inlet port and a purge out let port
    B) a purge gas source; and
    C) a component purge system comprising:
        1) a distribution system comprising purge lines for directing said purge gas from said purge gas source filter to the inlet port of each of said line narrowing chamber, said output coupler chamber and said wavemeter chamber;
        2) a purge monitoring system providing one or more signals indicative of the effectiveness of the component purge system; and
        3) a processor configured to control laser timeout duration based on said one or more signals from said purge monitoring system.

2. A laser system as in claim 1 wherein said purge monitoring system comprises one more more purge flow monitors.

3. A laser system as in claim 1 wherein said purge monitoring system comprises at least one oxygen monitor.

4. A laser system wherein said component purge system comprises a purge gas filter.

5. A laser system as in claim 1 and further comprising a high voltage cable at least a portion of which is contained in a sealed cable chamber having a purge gas inlet port and a purge gas outlet port wherein said distribution system also comprises a purge line for directing purge gas to said inlet port of said sealed cable chamber and said flow collection system also comprises a purge collection line for directing purge gas from said exit port of said cable chamber to a flow monitor.

6. A laser system as in claim 1 wherein said purge gas comprises nitrogen.

7. A laser system as in claim 1 wherein said purge gas comprises helium.

8. A laser gas system as in claim 1 and further comprising a means for recirculating a portion or all of said purge gas directed to said flow monitors.

9. A laser system as in claim 1 wherein all of said purge lines and all of said collection lines are comprised of stainless steel.

10. A laser system as in claim 1 wherein said flow collection system also comprises a purge collection line for directing purge gas from said exit port of said sealed high voltage chamber to a flow monitor.

11. A laser system as in claim 1 and further comprising a means for recirculating a portion or all of said purge gas.

12. A laser system as in claim 1 wherein said component purge system comprises a bypass valve permitting purging of said line narrowing chamber, said output coupler chamber and said wavemeter chamber when electrical power to other portions of said laser system has been disconnected.

13. A laser system as in claim 12 wherein said component purge system comprises an electrical power source permitting operation of said purge monitoring system when electrical power to other portions of said laser system has been disconnected.

14. A laser system as in claim 1 wherein said component purge system comprises an electric power switch permitting operation of said purge system when electrical power to other portions of said laser system has been disconnected.

* * * * *